(12) United States Patent
Slisher

(10) Patent No.: US 7,381,577 B2
(45) Date of Patent: Jun. 3, 2008

(54) EARLY DETECTION TEST FOR IDENTIFYING DEFECTIVE SEMICONDUCTOR WAFERS IN A FRONT-END MANUFACTURING LINE

(75) Inventor: Dustin K. Slisher, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 10/907,870

(22) Filed: Apr. 19, 2005

(65) Prior Publication Data

US 2006/0234401 A1   Oct. 19, 2006

(51) Int. Cl.
*G01R 31/26* (2006.01)
(52) U.S. Cl. ............... 438/17; 438/14; 257/E21.521
(58) Field of Classification Search ............ 438/14–18
See application file for complete search history.

(56) References Cited

U.S. PATENT DOCUMENTS

| | | | | |
|---|---|---|---|---|
| 4,512,074 | A | * | 4/1985 | Sasaki .................. 438/362 |
| 4,542,340 | A | * | 9/1985 | Chakravarti et al. ........ 324/769 |
| 5,787,190 | A | * | 7/1998 | Peng et al. ............. 382/145 |
| 6,023,327 | A | * | 2/2000 | Shabde et al. .......... 356/237.1 |
| 6,350,636 | B1 | * | 2/2002 | Lee et al. ............. 438/186 |
| 7,019,513 | B1 | * | 3/2006 | Faifer et al. ........... 324/158.1 |
| 2003/0227293 | A1 | * | 12/2003 | Sidner et al. ........... 324/765 |
| 2006/0059452 | A1 | * | 3/2006 | Whitefield et al. ......... 716/20 |

OTHER PUBLICATIONS

Faifer et al. Non-contact Electrical Measurements of Sheet Resistance and Leakage Current Density for Ultra-shallow (and other) Junctions. MRS Res Soc. Symp. 2004 present Apr. 12-16.*
Swartz et al. "Gate Isolation Cobalt Silicide Processing," Journal of Electronic Materials 19,171 1990.*
Loiko et al. "The impact of Point Defects on Stress induced Dislocation Generation in Silicon," Mat. Res. Soc. Symp. vol. 610 B6.13.1-B6.13.6 2000.*
Yarema et al. "Wafer level Testing of ASICs for Silicon Strip Detectors," 4th International Meeting on Front End Electronics for Tracking Detectors at Future High Luminosity Colliders 2000.*
Kopanski et al. "Review of Semiconductor microelectronic test structures with applications to infrared detector materials and processes," Semiconductor Sci. Tech. 8 888-910, 1993.*

* cited by examiner

*Primary Examiner*—Bradley Baumeister
*Assistant Examiner*—Matthew L Reames
(74) *Attorney, Agent, or Firm*—H. Daniel Schnurmann

(57) ABSTRACT

A method and apparatus for identifying defective partially manufactured semiconductor wafers in a manufacturing line is described, wherein defects caused by silicon erosion created by over-etching the wafer can be detected. The method described herein is based on an in-line test of selected structures, such as FETs, located in the kerfs that surround the integrated circuit chips. Leakage current between the gate and the source-drain region is measured at FETs in each kerf. Based on the measurement, a leakage current map is created and compared to a standard map. In accordance with this comparison and to the distribution of patterns of leakage currents, it is determined whether or not the wafer is defective. This determination is performed in the kerfs after formation of the gate and source-drain regions, and prior to the wafer being completed. By detecting defective wafers at an early stage, considerable manufacturing resources are saved.

11 Claims, 13 Drawing Sheets

| Wafer No. | Current Distribution | Yield /% | Visible Silicon Erosions |
|---|---|---|---|
| 1 | | 100 | None |
| 2 | | 45 | Many |
| 3 | | 45 | Many |
| 4 | | 92 | Rare |
| 5 | | 53 | Many |
| 6 | | 90 | Rare |

| Wafer No. | Current Distribution | Yield /% | Visible Silicon Erosions |
|---|---|---|---|
| 1 |  | 100 | None |
| 2 |  | 45 | Many |
| 3 |  | 45 | Many |
| 4 |  | 92 | Rare |
| 5 |  | 53 | Many |
| 6 |  | 90 | Rare |

EARLY DETECTION TEST FOR IDENTIFYING DEFECTIVE SEMICONDUCTOR WAFERS IN A FRONT-END MANUFACTURING LINE

BACKGROUND OF THE INVENTION

This invention relates to a method and apparatus for in-line testing a semiconductor wafer in the process of fabricating Very Larger Scale Integrated (VLSI) circuits and, more specifically, to a method and apparatus for automatically identifying during the front-end phase of a manufacturing line, the presence of defects, e.g., caused by silicon erosion.

The fabrication process of VLSI circuits includes a large number of manufacturing steps where defects may be created, leading to a circuit malfunction or low performance. Defects are attributable to a variety of causes, for instance, particles included in the photoresist, contamination introduced during a manufacturing step and silicon erosion. The latter is known to significantly affect the characteristics of semiconductor devices, particularly to FETs, creating an undesired high resistance in the source-drain region. Silicon erosion may be created during the following manufacturing steps. A gate stack, including a gate oxide and a polysilicon gate electrode, is formed on a silicon substrate followed by re-oxidation of the surface of the substrate to form a re-oxidized silicon layer. Sidewall spacers, including silicon nitride ($Si_3N_4$) or silicon dioxide ($SiO_2$) are then formed on both sides of the gate stack for aligning ion implantation into the source and drain regions. The process of forming spacers includes the deposition of silicon nitride or silicon dioxide layers and etching the deposited layers. This etching is typically achieved by way of reactive ion etching (hereinafter referred to as "RIE"). Throughout the process of forming the spacers, the re-oxidized silicon layer is exposed to RIE, thereby reducing the thickness of the layer. Particularly, in the source and drain regions which are not covered by sidewall spacers, part of the re-oxidized silicon layer may be etched through into the silicon substrate. As a result, part of the silicon is removed, causing a defect in the silicon substrate.

FIG. 1A shows a cross-section of a conventional semiconductor wafer where no silicon erosion is observed. The structure includes gate stacks 110 on channel regions 132 formed on the silicon substrate 102. The gate stacks 110 consist of polysilicon electrodes 126 and silicon oxide layers 122 intervening between the silicon substrate 102 and the polysilicon electrodes 126. Re-oxidized layers 120 cover the side walls of the gate stacks 110 and extend to cover the edges of the source-drain regions 104. Spacers 112 are deposited adjacent to the side walls of the gate stacks 110. The respective spacers include sub-layers to form the spacers multilayer structure. The level of the upper surfaces 142 of the source-drain regions 104 coincide with the upper surface 144 of the silicon substrate.

FIG. 1B illustrates a cross-section of the semiconductor device in which silicon erosion 198 is seen in the source-drain region 154. Dotted line 192 shows the desired level of the upper surface of the silicon substrate 152 after formation of spacers 162. In the silicon erosion layer 198, the actual level of the surface of the silicon substrate 152 is lowered below the desired level 192 due to the unwanted removal of silicon. The depth of the defect in the silicon erosion may be as larger as 5 nm. Such silicon erosion leads to a high resistance of the source-drain region 154. The increase in resistance is caused by a high concentration of doping located near the surface.

In accordance with conventional manufacturing practices, the wafer test and evaluation of the wafer is performed after completing the wafer, as will be described hereinafter.

Manufacturing a semiconductor VLSI begins with setting a silicon wafer on a production line. Subsequent processes can be broadly classified into wafer processing, assembling and testing. The wafer process typically includes a front-end of the line (FEOL) process, a back-end of the line (BEOL) process, followed by a good chip/wafer (G/W) test of the wafer. During FEOL, an epitaxial layer, an isolation layer, a well, a gate insulating layer, a gate electrode, spacers adjacent the gate electrode and source drain regions are sequentially formed on the wafer. Then, the surfaces of the source-drain regions are silicided. Next, the manufacturing process moves to BEOL where metal wiring is provided above the semiconductor structure on the wafer, followed by a passivation layer formed on the topmost layer, completing the wafer.

The wafer is evaluated based on inspection techniques, such as the G/W test, followed by assembly and test. The G/W test identifies the good (or bad) semiconductor chips formed on the wafer. It is performed subsequent to completing the wafer, and follows the formation of all the elements, such as semiconductor structures, interlayer dielectric, electrode contact metallization, that are necessary for the subsequent back-end of the line.

The G/W test generally consists of the following steps. First, the wafer is positioned on a stage for inspection. A probe card is then applied to the wafer, and inspection probes are brought in contact with respective contact pads on the IC chips formed in the wafer. Next, input signals are applied to the IC chips through the inspection probes to observe the electrical signals as seen at the primary outputs of the ICs. Depending on the responses, it is determined whether or not respective ICs on the wafer have the desired characteristics and performance. However, as previously mentioned, silicon erosion may already have been created in an earlier process, e.g., during the formation of the spacers adjacent the gate stack, before forming the upper structures, such as interlayer dielectric and electrode contact metallization. Although, as mentioned previously, silicon erosion causes a significant deterioration in performance and characteristics of the ICs, wafers including bad chips cannot be identified until the wafer process terminates, i.e., in the G/W test following the BEOL phase. This results in a waste of resources by completing bad wafers to their very end.

In addition to the final G/W test of the wafer, other in-line tests are typically performed during the wafer process in real-time by using structures formed in unoccupied spaces between the IC chips on the wafer. By way of example, and referring to FIG. 2, there is shown wafer 200 and a partially enlarged view thereof. In the upper section of the figure, grid lines 252 represent unoccupied spaces. During the dicing process subsequent to BEOL, the wafer is cut alongside unoccupied spaces between the individual IC chips. Some of the unoccupied spaces 252 include test regions 211, 212, 213, referred to "kerfs". In the lower portion of the figure, kerfs are represented by shaded rectangles between IC chips 201, 202, 203. The kerfs are subject to the same process manufacturing steps as the semiconductor structures in the IC chips. Therefore, an examination of the electrical characteristics during the wafer process and the occurrence of defects created in IC chips adjacent the respective kerfs can be determined. These are characteristic of defaults found anywhere in the wafer.

FIG. 3A shows a block diagram of a typical system to perform an in-line test. The system includes a tester 302, a space transformer 304 and an inspection probe 312. The tester 302 is computer driven and is set to execute an in-line test program. The tester 302 is connected to space transformer 304 via communication line 303. The space transformer 304 is further attached to inspection probe 312 via a driving mechanism 310 which couples the communication line 303 between the space transformer 304 and the inspection probe 312. The tester 302 controls the space transformer 304 in accordance with the program. In response to a request from the program, the space transformer 302 moves the inspection probe 312.

FIG. 3B shows an enlarged view of a section of the inspection probe 312 and kerf 390 illustrated in FIG. 3A. The inspection probe 312 is equipped with electrodes 362, 364, 366, 368, 370 spanning from the bottom surface of the inspection probe 312 opposite to the upper surface of the wafer 300. Electrodes are connected to the tester 302 through lines 303, 310 and space transformer 304 so that the tester can apply desired voltages to the electrodes in accordance with the program, allowing the tester to detect signals from the electrodes. The kerf 390 further includes a semiconductor structure 301 for testing and portions of the semiconductor structure connected to conductive pads 322, 324, 326, 328, 330.

In accordance with the in-line test program, inspection probe 312 is positioned to make contact with electrodes 362, 364, 366, 368, 370 and corresponding conductive pads 322, 324, 326, 328, 330. The tester 302 applies a predetermined input through the electrodes to the semiconductor structure 301 and observes the response signals from the semiconductor structure 301 through the conductive pads and electrodes. By analyzing the response signals, the program determines the condition of the wafer 300 in the production line.

According to conventional in-line testing, the presence of undetected defective devices leads to a considerable expenditure of resources to complete the formation of defective devices, followed by testing and identification in a wafer map.

Accordingly, there is a distinct need in industry for a method of identifying and a system for enabling such a methodology to eliminate defective devices early in the manufacturing process in order to increase the throughput and avoid wasting resources on devices that will eventually be scrapped. Therefore, it is desired to identify bad wafers in earlier stage of the wafer process.

Following are listed several patents that address various aspects of the aforementioned problems.

U.S. Pat. No. 6,673,640 to Naruoka describes a method of evaluating a crystal defect in a thin film SOI layer using an in-line test. Crystal defects are elucidated by transferring metal into the defects, followed by irradiation by laser beam of the SOI layer to cause excess carriers. The excess carriers are separated by applying a voltage to an interface between each defects and silicon of the SOI layer so that the excess carries are turned into an electric current. By measuring the electric current, defects in the SOI layer are evaluated. However, the patent does not mention the distribution of the measured currents in the SOI layer nor evaluates the defects based on the measured current distribution.

U.S. Pat. No. 6,350,636 to Lee et al. discloses a method for forming suicide test structures to monitor and evaluate the quality of semiconductive junctions after the formation of a silicide layer over the junction. The patent discloses specially designed test structures formed for in-line testing in the kerf of an IC wafer. A test structures is designed to measure the bulk junction leakage by having a silicide contact layer spaced away from the junction edge. The remainder of the test structure measures the edge related junction leakage, and is provided with a serpentine edge which the silicide layer extends to, and plural interior openings. However, the patent does not describe a test structure having a source-drain region between polysilicon gate stacks, which allows measurement of leakage current between the polysilicon gate stack and the source-drain region.

U.S. Pat. No. 6,315,574 to Kamieniecki et al. discloses an apparatus to perform real-time, in-line testing of semiconductor wafers during a manufacturing process. A source of light impinges upon the wafer as the wafer passes to an adjacent probe assembly, and the apparatus measures various electrical characteristics of the wafer based on the surface photo-voltage induced by light. There is no description of leakage current voltage between the gate stack and the source-drain region or use of the measured leakage current to determine the quality of the wafer.

SUMMARY OF THE INVENTION

Therefore, it is an object of the present invention to provide a method and an apparatus for identifying a defective wafer during the early stages of manufacturing by testing certain of its electric characteristics.

It is another object to provide an in-line test method and apparatus for identifying a defective wafer subjected to silicon erosion.

In one aspect of the invention, there is provided a method for identifying a defective semiconductor wafer partially processed, the semiconductor wafer having a plurality of structures built in a surface thereof, the method including the steps of:

a) applying a predetermined voltage and measuring leakage currents to one or more structures at various locations throughout the semiconductor wafer;

b) correlating the measured leakage currents to the respective location of the structures; and c) identifying a defective semiconductor wafer by mapping the correlations.

The method further includes the step of mapping the correlation of the measured leakage currents and comparing the map thus constructed against another known to be indicative of a good or bad semiconductor wafer.

The method further includes the step of plotting the measured currents against the respective positins of the selected structure. An instance of a plot displaying decreasing currents from the center of the wafer toward its periphery is indicative of a good wafer. Alternatively, a plot showing increasing currents from the center of the wafer toward its middle section, followed by decreasing currents from the middle section of the wafer toward its periphery is indicative of a defective wafer.

BRIEF DESCRIPTION OF THE DRAWINGS

These and other objects, aspects, and advantages of the present invention will be better understood when considered in conjunction with the following description and the accompanying drawings, which are not necessarily drawn to scale.

DETAILED DESCRIPTION

Figure 4A:
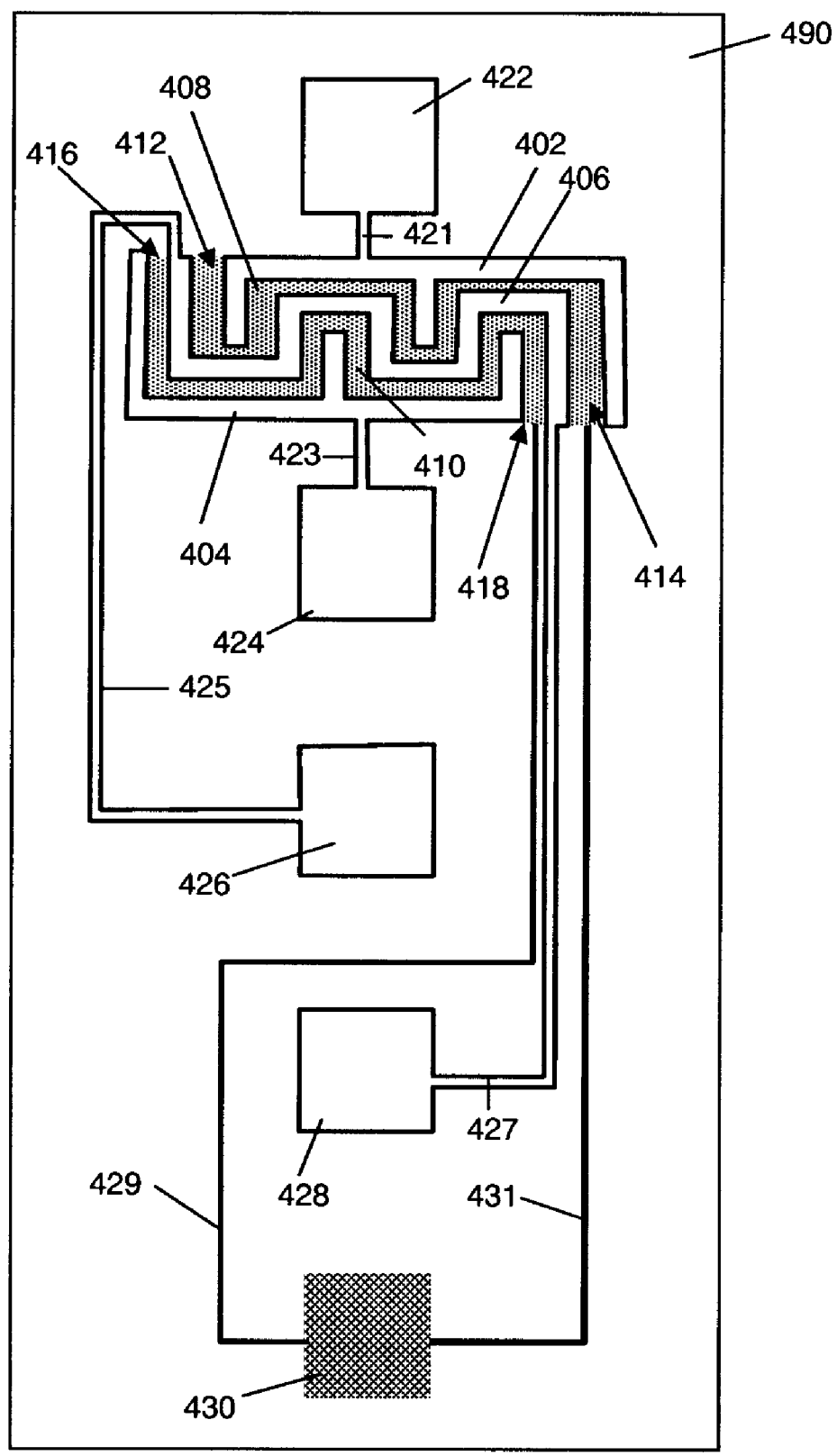
FIGS. 4A-4C show respectively a planar view of a kerf; a perspective view of a portion of the kerf illustrated in FIG. 4A; and a perspective cross-section view of the kerf at line A-A' shown in FIG. 4B.
Figure 4B:
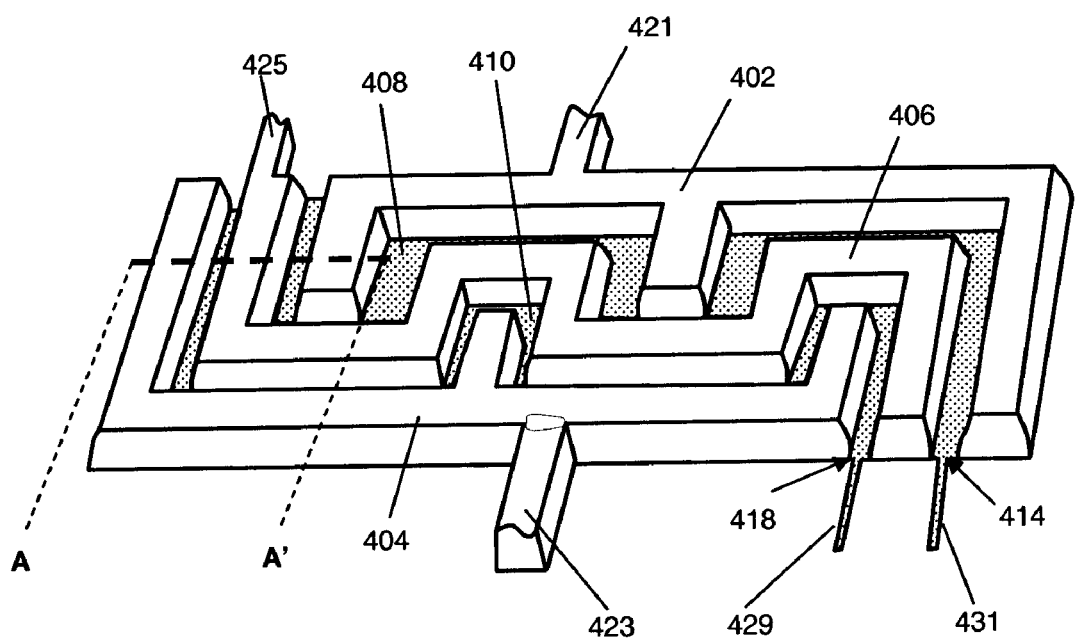
Figure 4C:
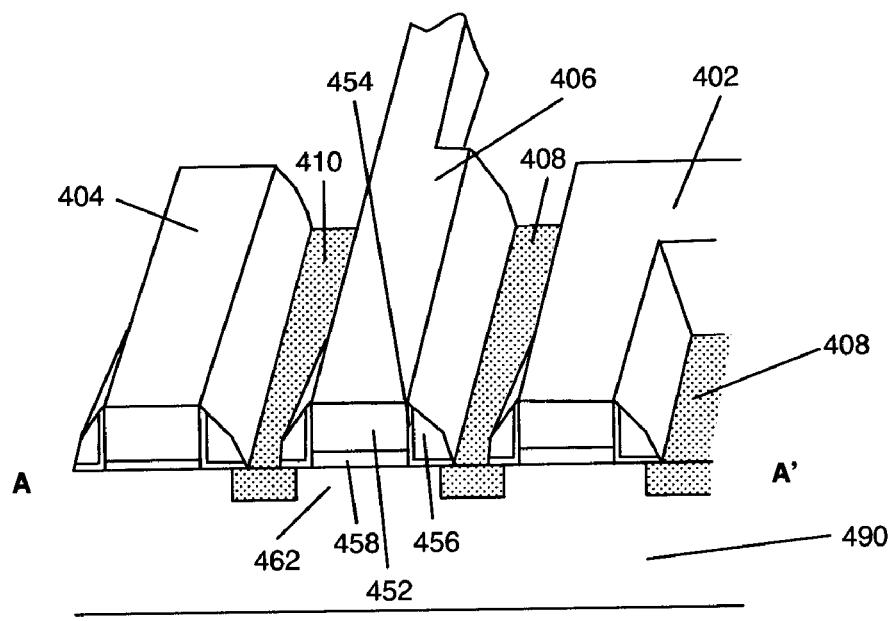

The invention will now be described with reference to FIGS. 4A, 4B and 4C showing a kerf suited for identifying a defective wafer in order to apply thereto the method of the present invention. For illustrative purposes, the determination of a defective wafer will be based in measuring the leakage current in structures built for this purpose in the kerf.

FIG. 4A shows a planar view of a kerf 490 on the wafer 400 (not shown). Also, FIG. 4B shows an enlarged perspective view of a portion of kerf 490.

The kerf 490 is formed during manufacture of an IC circuit associated thereof, i.e., under the same process conditions to which the IC circuit is subject to during its fabrication, except for the lithography patterns corresponding to the structures in the kerf 490. Therefore, when the illustrated structures are formed in the kerf, a gate stack, a spacer adjacent the gate stack, a source-drain region and silicidation on the source-drain region are formed in the region reserved for the IC circuit.

FIGS. 4A-4B illustrate a pair of interdigitated opposing comb-shaped gate stacks 402, 404 and a serpentine gate stack 406 between comb-shaped gate stacks 402, 404. Source-drain regions 408, 410 are formed between the gate stacks 402 and 406, 404 and 406, respectively. The source-drain region 408 is continuous from 412 through 414 so that gate stacks 402 and 406 oppose each other across the source-drain region 408. Similarly, source-drain region 410 extends itself continuously from 416 through 418 such that the gate stacks 404 and 406 oppose each other across the entire source-drain region 410. The combination of the interdigitated opposing comb-shaped gate stacks 402, 404 and the serpentine gate electrode stack 406 is shown as a preferable area for performing leakage current measurements, since kerf 490 is more susceptible to silicon erosion. However, a simpler structure such as a pair of a gate stacks and source-drain region may also be advantageously used depending on the susceptibility desired.

The gate stacks 402, 404, 406 are connected to contact pads 422, 424, 428 through lines 421, 423 425, respectively. The contact pads and the lines are integral to the gate stacks so that electrical contacts are established between them through polysilicon. The source-drain regions 408 and 410 are connected to contact pad 430 through lines 429, 431. The contact pad 430 and lines 429, 431 are formed by providing extensions of silicidation from the portions 414, 418 of the source-drain regions 408, 410.

FIG. 4C shows a perspective cross-sectional view of the kerf 490 as seen from line A-A' in FIG. 4A. The gate stacks 402, 404, 406 include insulation layers 458 on channel regions 462 and polysilicon gates 452. Re-oxidized layers 454 and spacers 456 are formed adjacent to the sidewalls of the gate stacks. The re-oxidized layers 354, 355 are protective layers covering the source-drain regions 308, 310 during RIE to form the spacers 356, 366. Each spacer further includes sub-spacers to form multilayered spacers depending on the process that is applied to the wafer 400. Between the gate stacks 404, 406, source-drain region 410 is aligned by the spacers 456. Similarly, the source-drain region 408 is aligned with spacer 456 on gate stack 402 and with spacer on gate stack 404. The surfaces of the source-drain regions 408, 410 are silicided by a silicidation process applied to wafer 400.

For simplicity, only one structure is shown to illustrate the process of measuring leakage current. However, kerf 490 may include additional structures better suited for other types of tests.

Figure 1A:
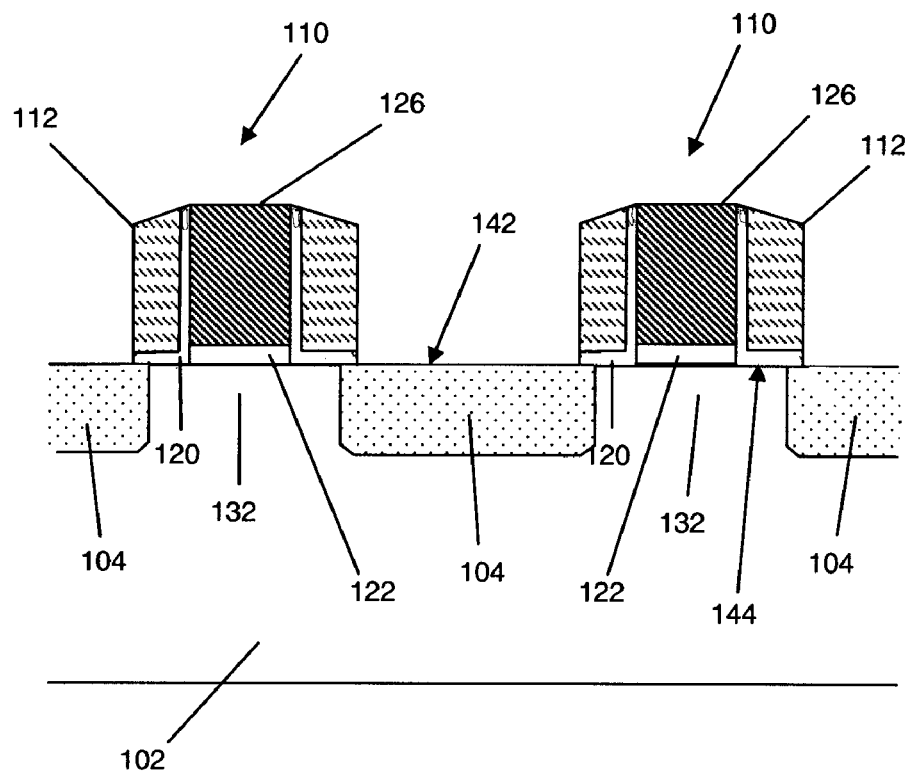
FIG. 1A shows a prior art semiconductor structure where no silicon erosion is observed in the source-drain regions.
Figure 1B:
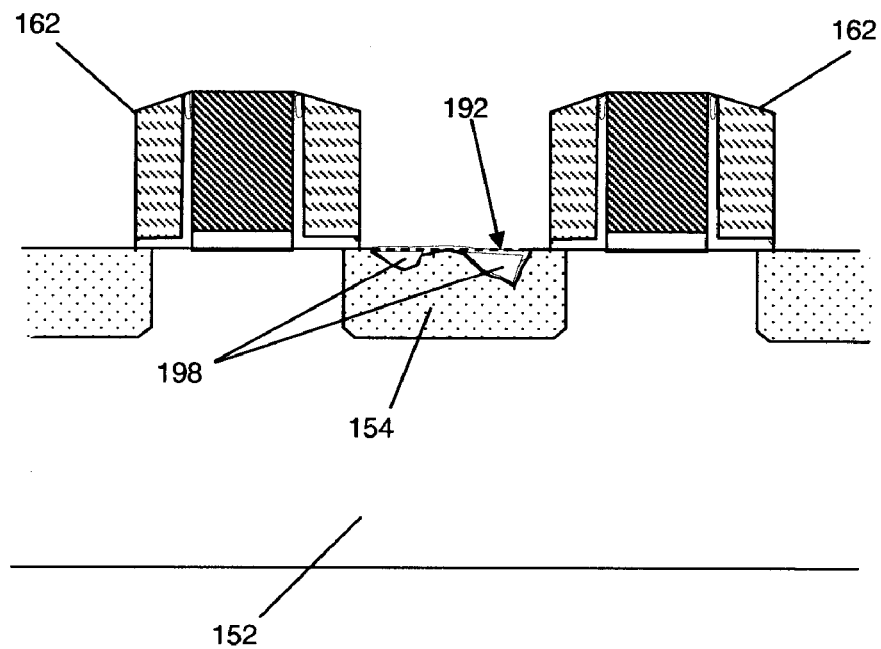
FIG. 1B is a cross-section of a prior art semiconductor structure showing the effect of a typical silicon erosion.
Figure 2:
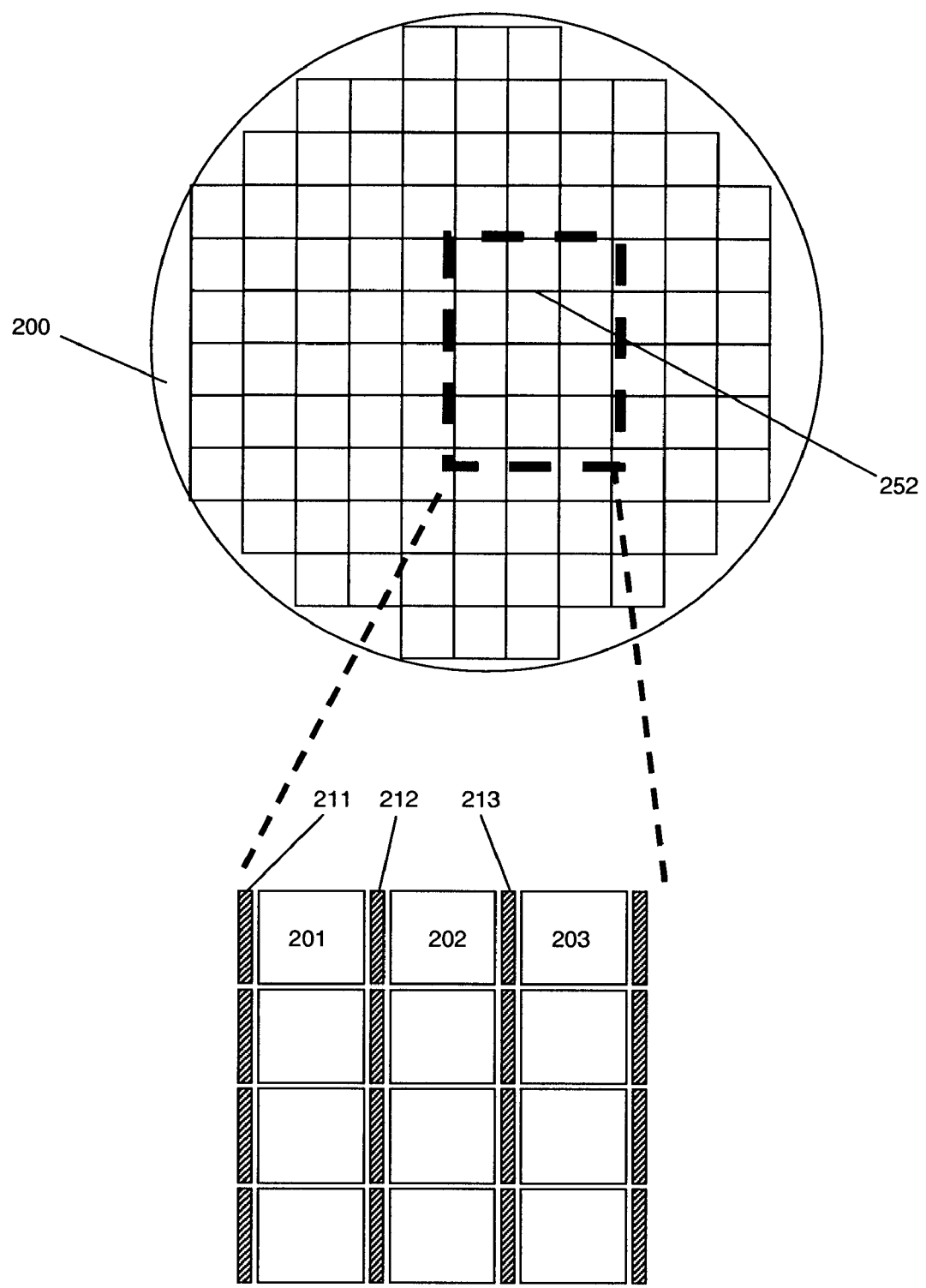
FIG. 2 shows a conventional wafer including kerf regions, and an adjoining partially enlarged view thereof.
Figure 3A:
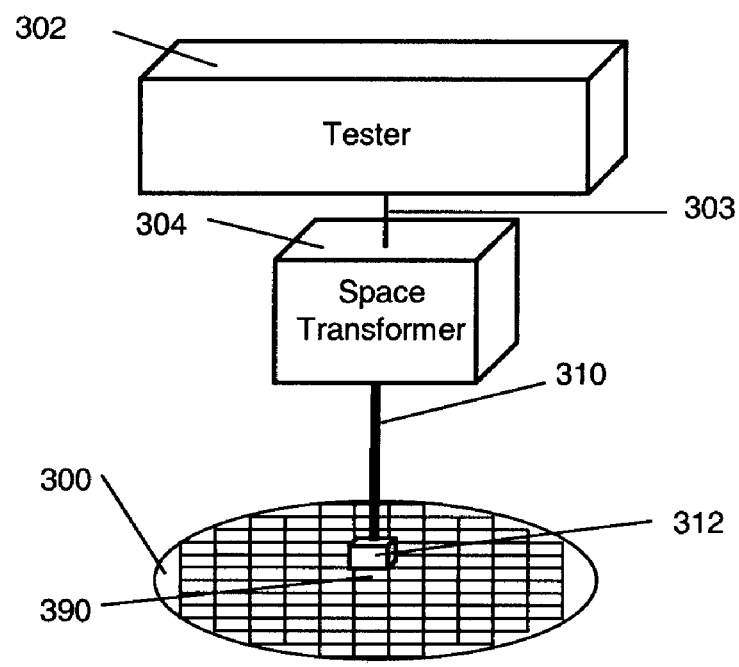
FIG. 3A is a block diagram of a prior art system for testing a wafer.
Figure 3B:
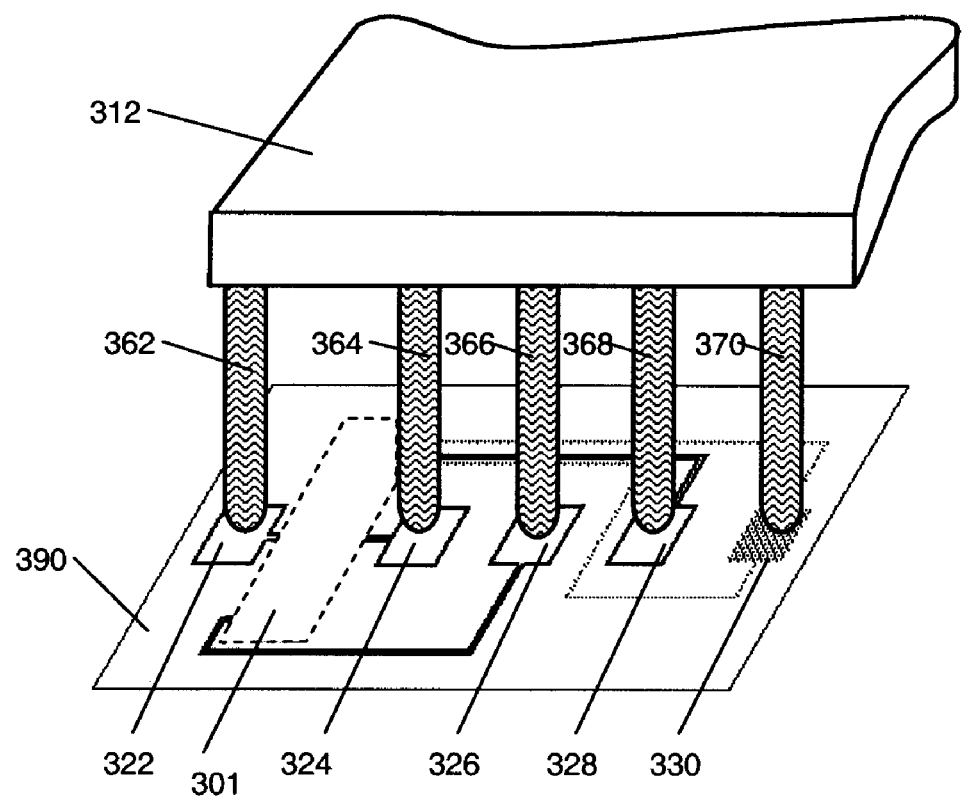
FIG. 3B shows an enlarged view of part of an inspection probe and kerf.

The leakage current measurement in accordance with the present invention is performed as follows. The combination of the tester 302, space transformer 304, driving mechanism 310 and inspection probe 312, as illustrated in FIGS. 3A and 3B, can be advantageously used to perform the current measurements by installing, from a computer readable medium, a program designed for in-line test and adapted to tester 302. The program includes an algorithm customized for performing leakage current measurements. In response to a request from the program, the tester 302 instructs the space transformer 304 to activate the driving mechanism 310 to move the inspection probe 312 adjacent to a selected kerf (e.g., kerf 490), and then to contact the respective electrodes 362, 364, 366, 368, 370 with the corresponding electrode pads 422, 424, 426, 428, 430. Accordingly, the electrodes 362, 364, 366, 368, are electrically connected to gate stacks 402, 404, 406, 406, respectively, while the electrode 370 is electrically connected to source-drain regions 408, 410.

Next, the tester 302 applies a voltage of approximately 0.15V to the electrodes 362, 364, 366, 368, while maintaining electrode 370 grounded. The voltage varies between 0.1V to about 1V and, preferably, between 0.1V and 0.4V. When a voltage higher than the range is applied thereto, the signal-to-noise ratio is significantly higher, making it harder to see the pattern. When higher voltages are applied, the tester will measure currents that are higher in magnitude, and which are caused by phenomena other than silicon erosion, swamping the silicon erosion leakage affect. On the other hand, voltages such as 0.1V are preferable to elicit leakages due to silicon erosion. Further, the tester 302 measures the current at electrode 370 that is connected to the source-drain regions 408, 410, applying a common voltage to gate stacks 402, 404, 406 through inspection probe 312 to the kerf 490, and then measuring the leakage current from the gate stacks through the source-drain regions 408, 410 to electrode 370. The measured current is stored in a storage device within the tester 302, in addition to its recorded position within the kerf 490.

Figure 5A:
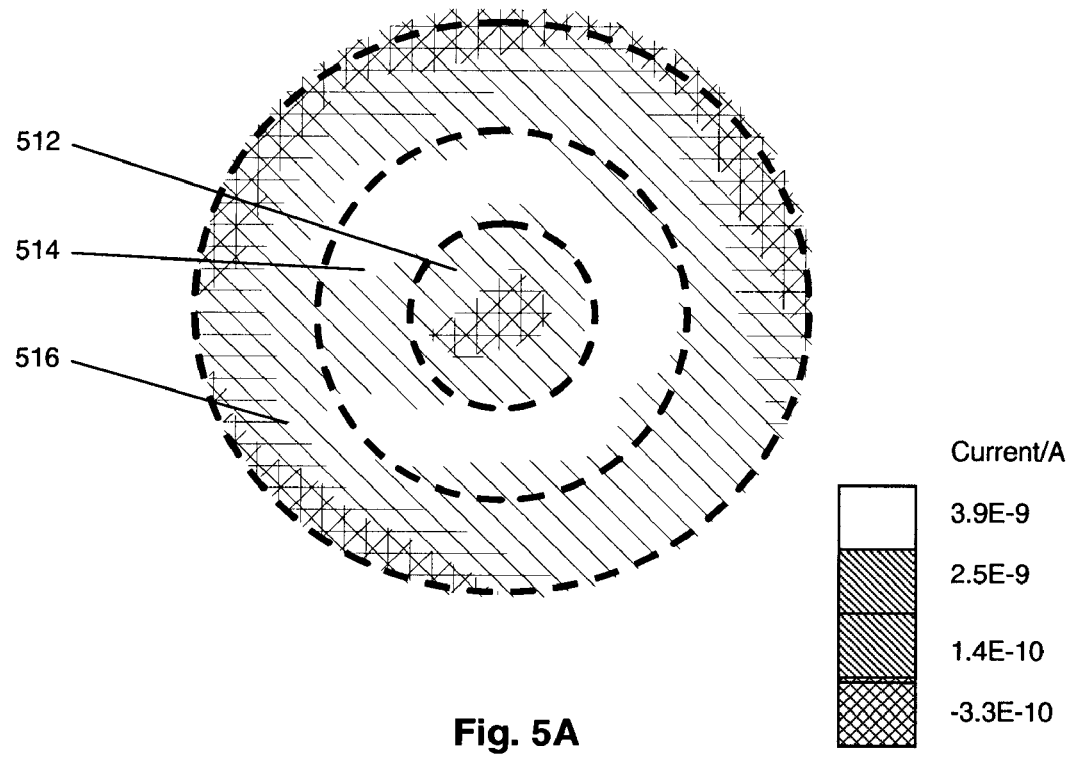
FIGS. 5A-5B show illustrative examples of a current distribution on the wafer observed in the data accumulation, according to the present invention.
Figure 5B:
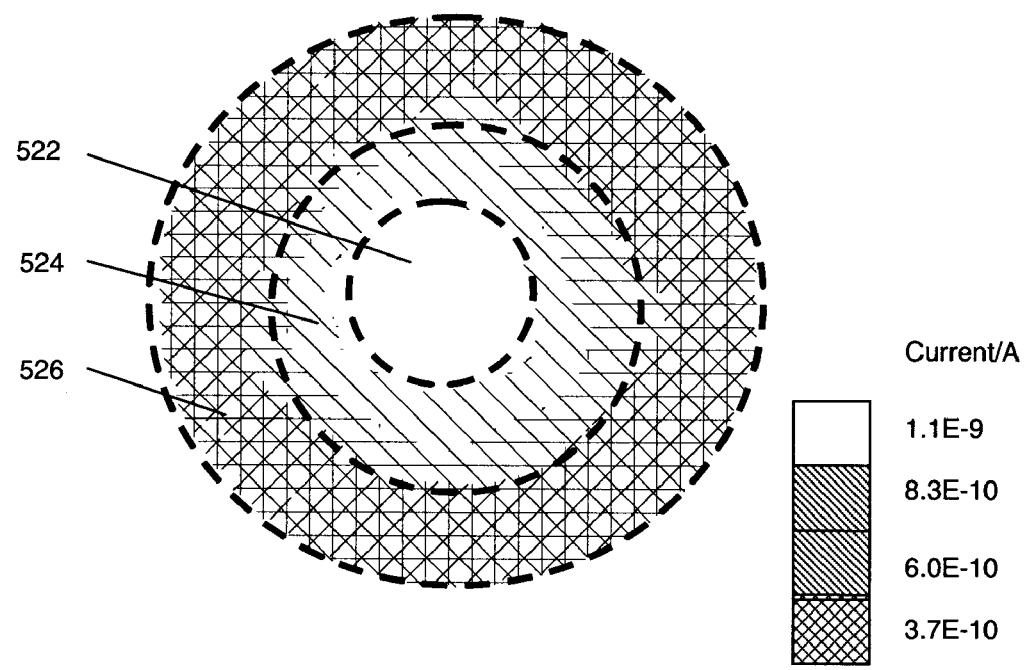

The above leakage current measurement is performed with respect to each kerf on the wafer 400 to obtain the leakage current distribution (i.e., a contour map), as shown in FIGS. 5A-5B. The maps are obtained by filling a pattern in each IC region of the wafer 400 that represents the leakage current measured in the kerf associated with a particular IC region. Each pattern represents the mean (or average) value obtained from several measured leakage currents. Alternatively, the maps may be created by interpolating the leakage current measured within the kerfs.

The contour map shown in FIG. 5A exhibits a lower leakage current region in the peripheral region 516 of the wafer 400 and a higher leakage current region in the middle 514 of the wafer, and again a lower leakage current region at the center 512 of the wafer. The contour map is indicative of defective wafer, and which yield is 45%. (The yield is the ratio of the IC chips on the wafer, which pass the G/W test respective to the total number of chips on the wafer.)

Alternatively, the contour map shown in FIG. 5B displays a higher leakage current region at the center 522 of the wafer and a concentric decrease of leakage current toward the peripheral 526 of the wafer. This contour map is representative of a good wafer whose yield is, ideally, 100%.

As will be described hereinafter with reference to FIG. 9, the relationship between the distributions of the currents in the wafer, according to the present invention, and which determines the quality of the wafer. Thus, the quality of the wafer can be advantageously established based on the current distribution (e.g., a contour map) of the wafer measured during the manufacturing process of the wafer. Accordingly, the quality of the wafer determined by the G/W test after BEOL can be predicted based on the leakage current measurement at a certain stage of the manufacturing process, e.g., FEOL. Based on this prediction, one may decide whether the wafer should be further processed or discarded. By way of example, if the predicted yield of the wafer is at least 80%, the wafer is deemed to be a good wafer, and is processed to completion. Good ICs are selected in accordance with the outcome of the final test, which is typically performed at the end of BEOL, and then the selected ICs are brought into a subsequent assembling process following dicing. Otherwise, if the predicted yield of the wafer is less than 80% (i.e. the wafer is considered a defective wafer), the wafer is eliminated from the production line so that no further resources are expended on defective wafers. The benchmark yield (in this case 80%) that distinguishes good wafers from defective ones can be defined arbitrarily.

Figure 6:
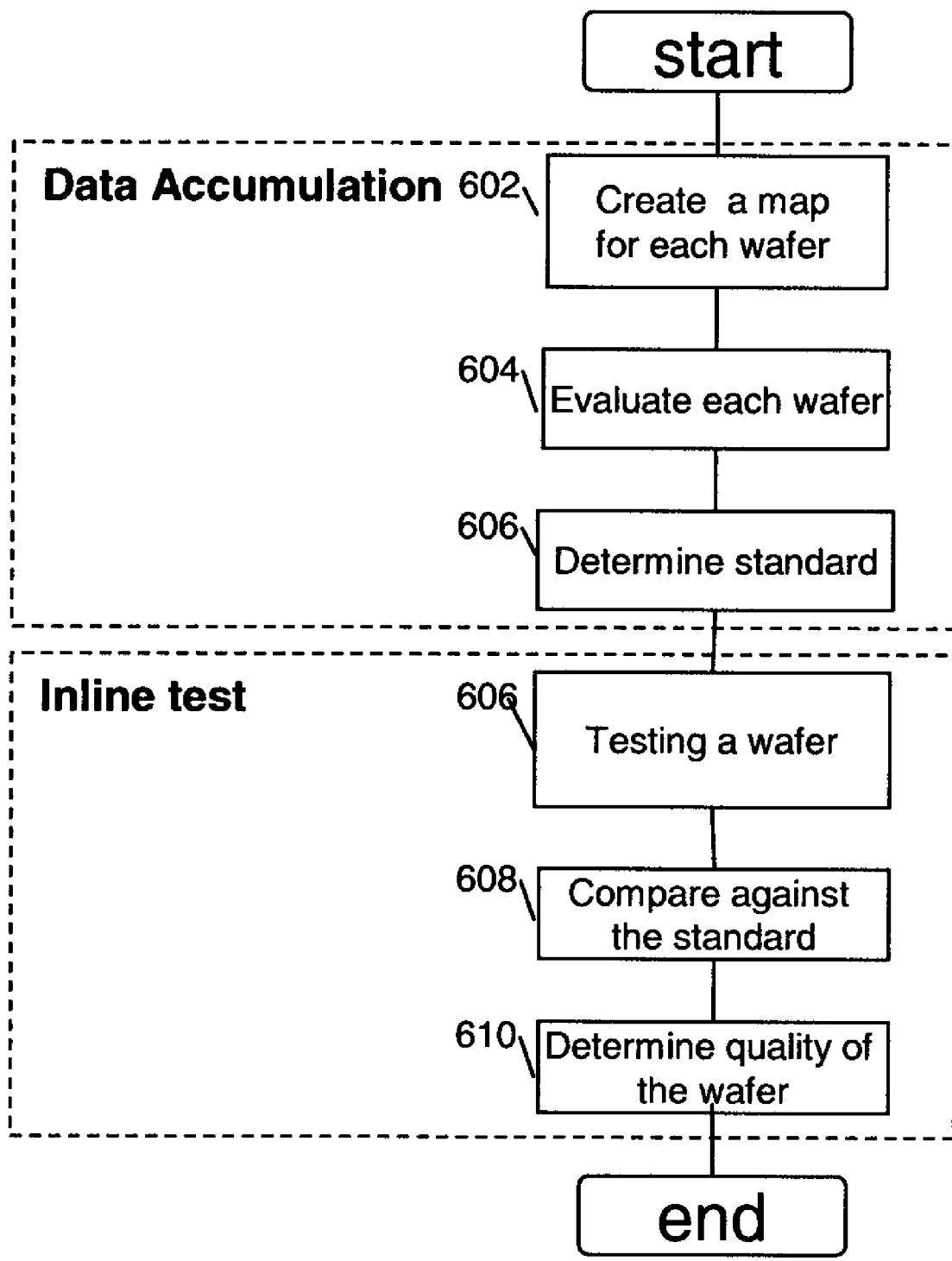
FIG. 6 shows an outline of the processes of the wafer quality determination, according to the invention.

FIG. 6 shows a gross outline of the determination of the quality of the wafer. Further details of the respective steps will be described referring to FIGS. 7 through 12.

In steps 602 through 606, data is accumulated based on the quality of the wafer determined by the in-line test. First, the current distribution of an appropriate number of sample wafers is obtained by performing leakage current measurements at various kerfs of the respective wafers (step 602). Next, the quality of the respective wafers is determined (step 604). A standard distribution is then created or selected based on the current distributions obtained from step 602, and the quality of the wafers determined in the step 604. Data accumulation (steps 602, 604, 606) is performed in a production line by selecting sample wafers from those processed on the production line. Alternatively, data accumulation may be performed on an experimental production line which is segregated from the production line and which is exclusively dedicated to data accumulation. Using a predetermined standard current distribution, an in-line test is performed to determine the quality of the wafer in a production line of the wafer. In the in-line test, the current distribution (e.g., the current contour map as described above) is obtained by measuring the leakage currents at the kerfs which is subject to the quality determination (step 606) in the above described manner. Then, the current distribution of the wafer is compared against the standard current distributions (step 608) determined in the data accumulation (step 606). Finally, based on this comparison, the quality of the wafer is determined (step 610).

Now, referring to FIGS. 7 through 12, details of the wafer quality determination will be described in detail hereinafter in conjunction with the data accumulation process.

Figure 7:
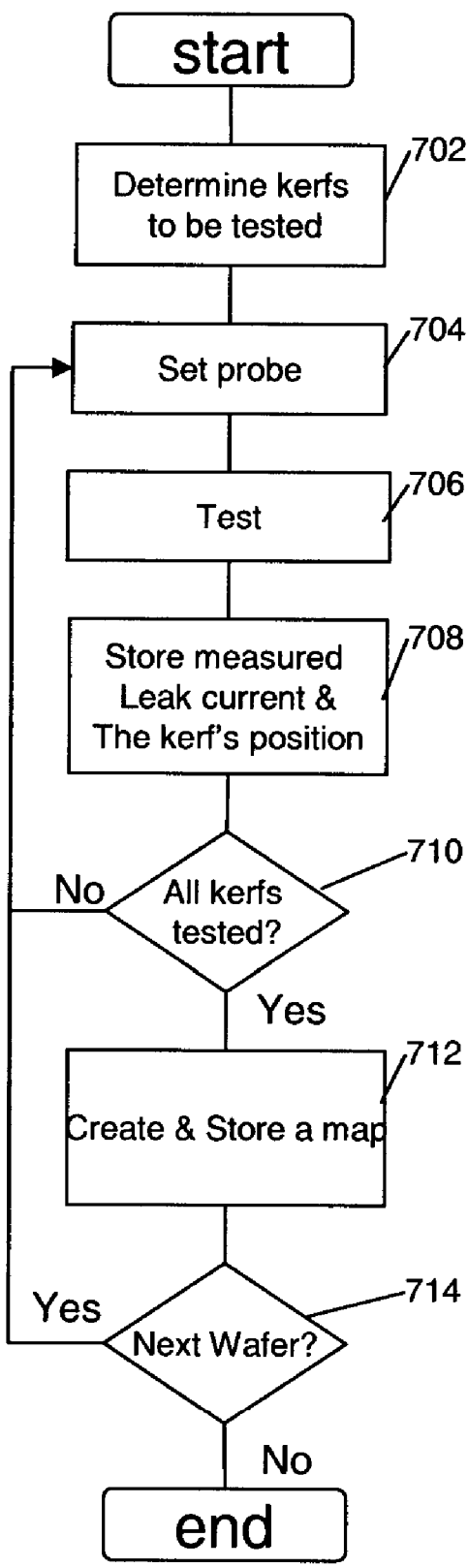
FIG. 7 shows details of a process for creating map of measured leakage currents for each wafer in the data accumulation, according to the invention.

FIG. 7 shows the details of the map creation (FIG. 6, step 602).

First, the kerfs to be tested are selected (step 702). The selection depends on the necessary granularity of the current distribution (e.g., a current contour map) of the wafer, or at a time frame given for the data accumulation. By way of example, the wafer quality determination program executed in the tester 302 acknowledges inputs from a user and recognizes the kerfs on which leakage current measurements are performed. Next, the electrodes 362, 364, 368, 370 of the inspection probe 312 are set onto corresponding contact pads in a first kerf among the selected kerfs (step 704). Then, as previously discussed in the explanation related to the leakage current measurement, a predetermined voltage is applied to the gate-source-drain pair of the kerf to measure the leakage current flowing through the pair (step 706). The measured current is stored in the storage device in tester 302 together with the kerf's position on the wafer (step 708). Steps 704 through 708 are repeated until all the selected kerfs are tested (step 710). Then, based on the set of measured currents associated with the kerfs' positions, a current distribution (a current contour map shown in, e.g., FIGS. 5A-5B) is created and stored in the storage device (step 712) alongside with the wafer ID, such as a serial number of the wafer.

Next, steps 702 through 712 are repeated with respect to other wafers (steps 714). The number of repetitions, i.e., of measured wafers, is arbitrarily set.

Figure 8A:
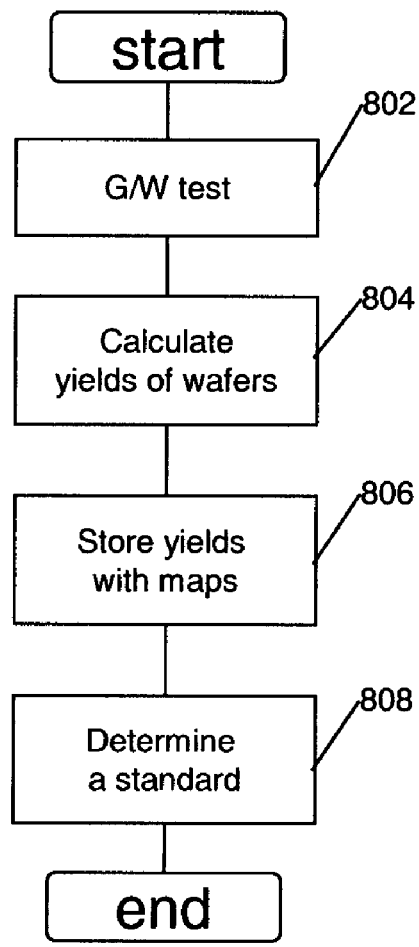
FIGS. 8A and 8B show details of the process of evaluating a wafer and comparing it to a standard based upon which other wafers are evaluated in the data accumulation phase, according to the invention.

FIG. 8A show an example of the process of the wafer evaluation (step 604) and the standard determination (step 606).

First, the tester 302 performs good chip/wafer (G/W) tests (step 802) with respect to the wafers whose current distributions have already been obtained. The details of the G/W test are well known by those skilled in the art, and are performed after completion of the wafers, i.e., after BEOL. Through the G/W tests, yields of the wafers are calculated (step 804). The yield is the ratio of the number of IC chips on the wafer, which can pass the G/W test over the number of chips on the wafer. Then, the yields of the respective wafers are correlated to current distributions of the wafers. The yields and the correlations are stored together with the current distributions (step 806). Based on the correlations between the current distributions of the wafers and the yield of the wafers, a standard current distribution is determined (step 808).

Figure 9:
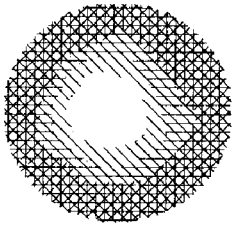
FIG. 9 shows a distribution map of wafers where leakage current occurs, with yields of the wafers and frequency of visible silicon erosion observed therein.
Figure 9:
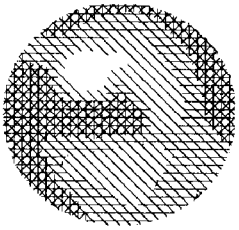
Figure 9:
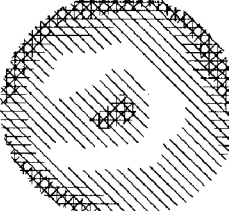
Figure 9:
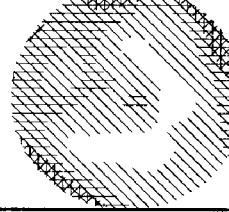
Figure 9:
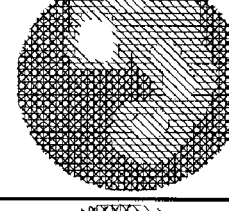
Figure 9:
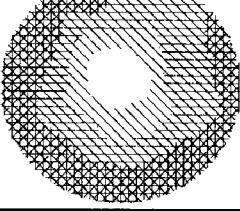

FIG. 9 illustrates the correlations between the current distributions on the respective wafers and yields of the wafers.

By way of example, a current distribution of wafer number 1 is selected as a standard current distribution of a good wafer (i.e., that meets the desired characteristics), since the yield of the wafer is 100%. A benchmark which categories the quality of the wafers, and divide them between good/or defective ones, can be appropriately determined to meet the economic considerations of the chip manufacturing process.

Alternatively, a current distribution 3 may be selected as the standard current distribution for a given defective (i.e., that does not meet designed specifications) wafer, or a standard current distribution may be synthesized based on plural current distributions weighed by the observed yields. For example, a standard distribution for a good wafer can be obtained by adding the observed currents at corresponding positions on wafer 1 (yield 100%) and wafer 6 (yield 90%) as follows:

(Current measured at kerf No. X on wafer 1)*100+
(Current measured at a Kerf No. X on wafer 6)*90)/(100+90)

Figure 8B:
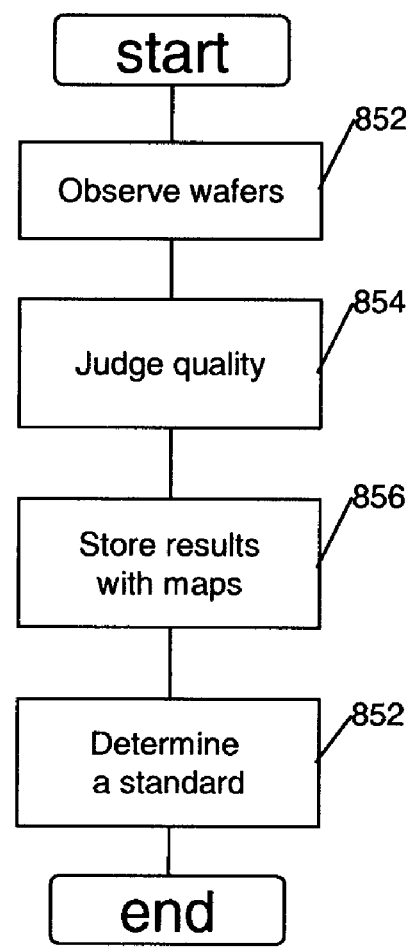

FIG. 8B shows another example of wafer evaluation and the standard determination.

Microscopic observations are first performed to identify frequency of defects, such as silicon erosion, in the respective wafers whose current distributions have already been obtained (step 852). The observations are made by selecting the wafers from a production line, preferably after BEOL, and dicing the completed wafer to prepare for the microscopic observation to view defects, such as silicon erosions. A sample wafer is diced to expose certain areas of the surface of silicon substrate of the wafer. Then, the surface is microscopically scanned to count silicon erosions in the area.

FIG. 9 illustrates the frequency of occurrence of silicon erosion in the wafers. Benchmarks, such as 'none', 'many' and 'rare', which are indicative of the frequency of occurrence of defects, can be defined arbitrarily.

Next, similar to the first example shown in FIG. 8A, a standard current distribution is selected based on the observations. For example, the current distribution 1 is selected for a good wafer because no silicon erosion is observed therein. Alternatively, the current distribution 2 may be selected as a defective wafer because it includes significant silicon erosion. Similar to the first example, a benchmark which divides the quality of the wafers into good/or defective can be appropriately determined to satisfy the economical requirement of the manufacturing process. Further, alternative methods for determining a standard distribution as described in the first example are also applicable to the second.

Figure 10:
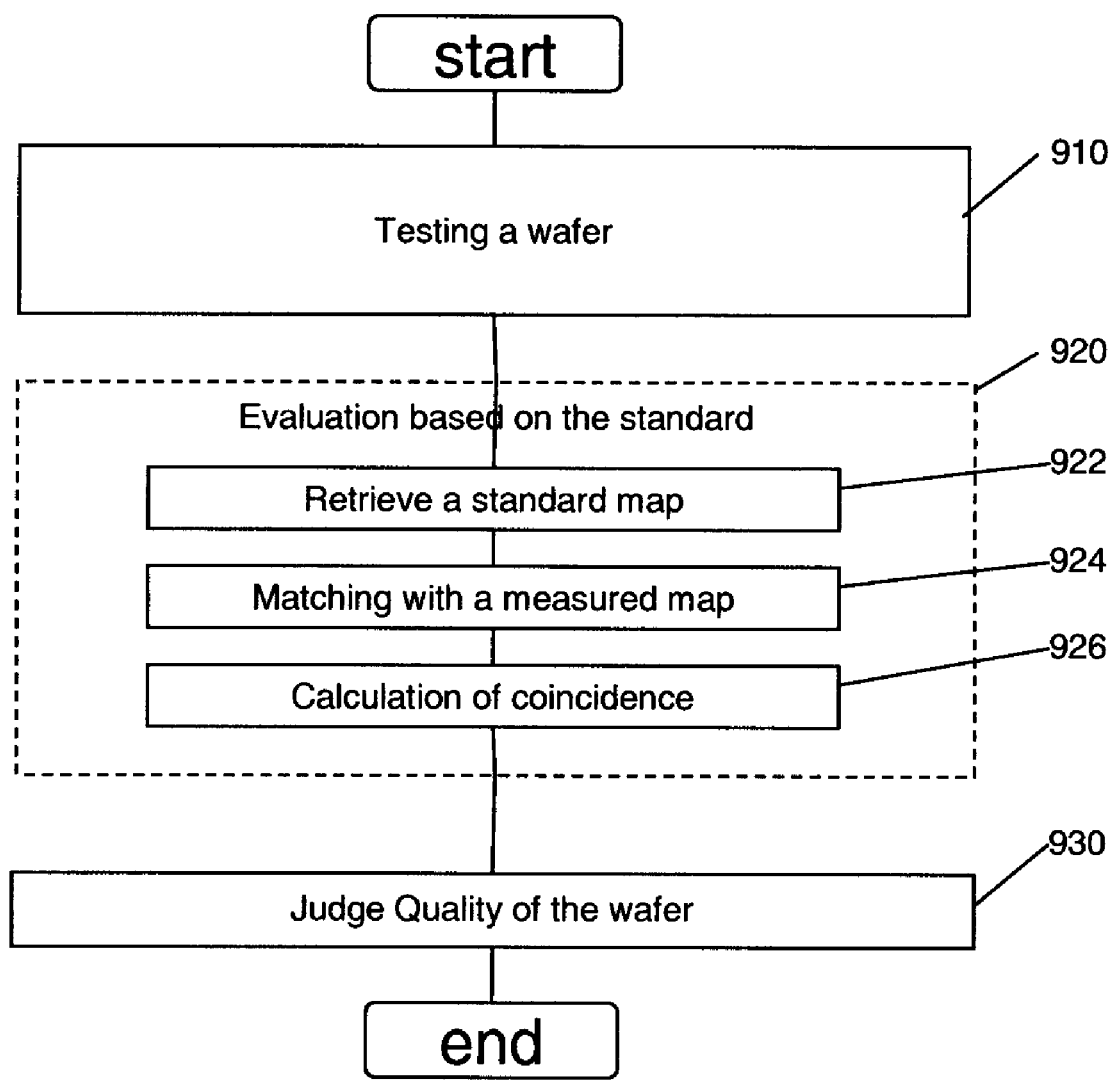
FIG. 10 shows a generalized flow chart to describe details of the in-line test according to the invention.

FIG. 10 shows details of the in-line test illustrated in FIG. 6. First, with respect to the wafer on a production line which is subject to the in-line test according to an embodiment of the invention, leakage current measurements are performed as above described, and a current distribution of the wafer is obtained (step 910). Leakage currents measurement are performed after formations of the gate stacks, spacers and source-drain regions but, preferably, before forming the upper structures, such as interlayer dielectrics and metal contacts. Next, the in-line test moves to the evaluation phase of the resulting current distribution of the wafer (920). A standard current distribution determined by the data accumulation (FIG. 6, steps 602-606, or, more specifically FIGS. 7, 8A or 8B) is retrieved from the storage device (step 922) in the tester 302. The standard current distribution retrieved is then compared with the current distribution of the wafer currently on the production line (step 924). This step includes a comparison of the currents at various positions on the wafer with respect to the currents at corresponding positions of the standard distribution, and adding up coincidences of the respective positions (step 926).

Finally, the quality of the wafer is predicted based on matching the standard current distribution against the current distribution of sample wafers extracted from the production line (step 930). By way of example, the quality of wafers in the production line can be predicted by matching the wafers against a standard 'good' wafer and the current distribution observed. Practitioners of the art will readily appreciate that other appropriate pattern matching schemes can be adopted in the above evaluation and determine the quality prediction with equal success.

Figure 11:
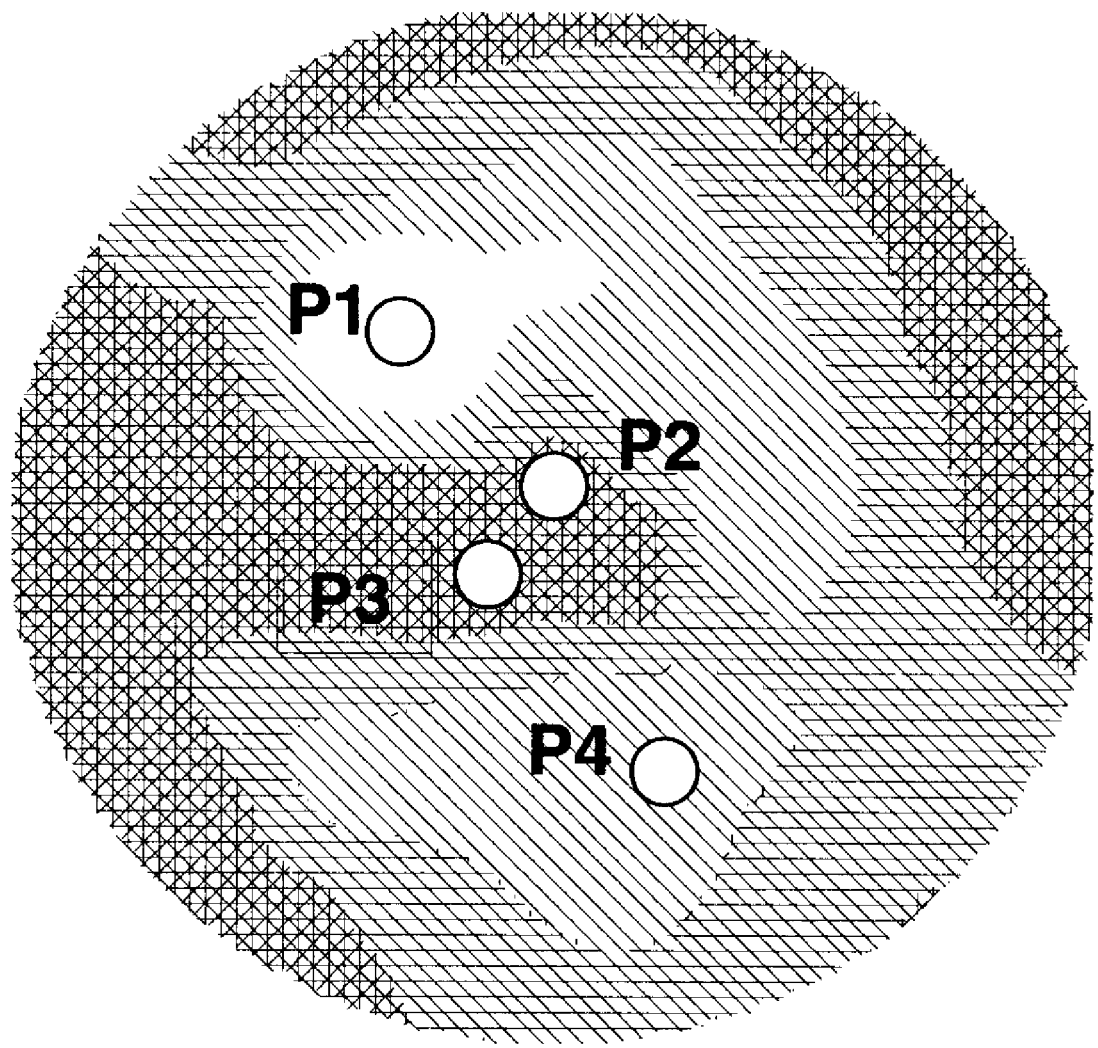
FIG. 11 shows the distribution of the leakage current for a wafer exhibiting low yield, according to the invention.

When comparing the current distribution against the standard distribution, a simpler way can be adopted, according to a second embodiment of the present invention. As explained with reference to FIGS. 5A and 5B, it is observed that defective wafers tend to exhibit a current distribution where lower leakage currents are observed near the center of the wafer while higher currents are found at middle portions of the wafer. Sometimes, the higher current portions exhibit a doughnut shaped distribution. For example, the wafer whose currents distribution is shown in FIG. 11 exhibits a low yield (45%). Accordingly, the current variation can be adopted as a standard for a defective wafer instead of a current distribution (contour map) as illustrated in FIG. 9. More specifically, the condition leakage current at midpoint of the wafer>leakage current at the center of the wafer can be adopted as a standard for a defective wafer. Under such a standard, the measurement of the wafer on a production line (FIG. 6, step 606) can be simplified because several points such as P1 through P4 are sufficient to perform the necessary leakage current measurements. Measurement positions P1 and P4 are preferably set at the middle of the radius of the wafer while measurement positions P2 and P3 are set at the center thereof.

Figure 12:
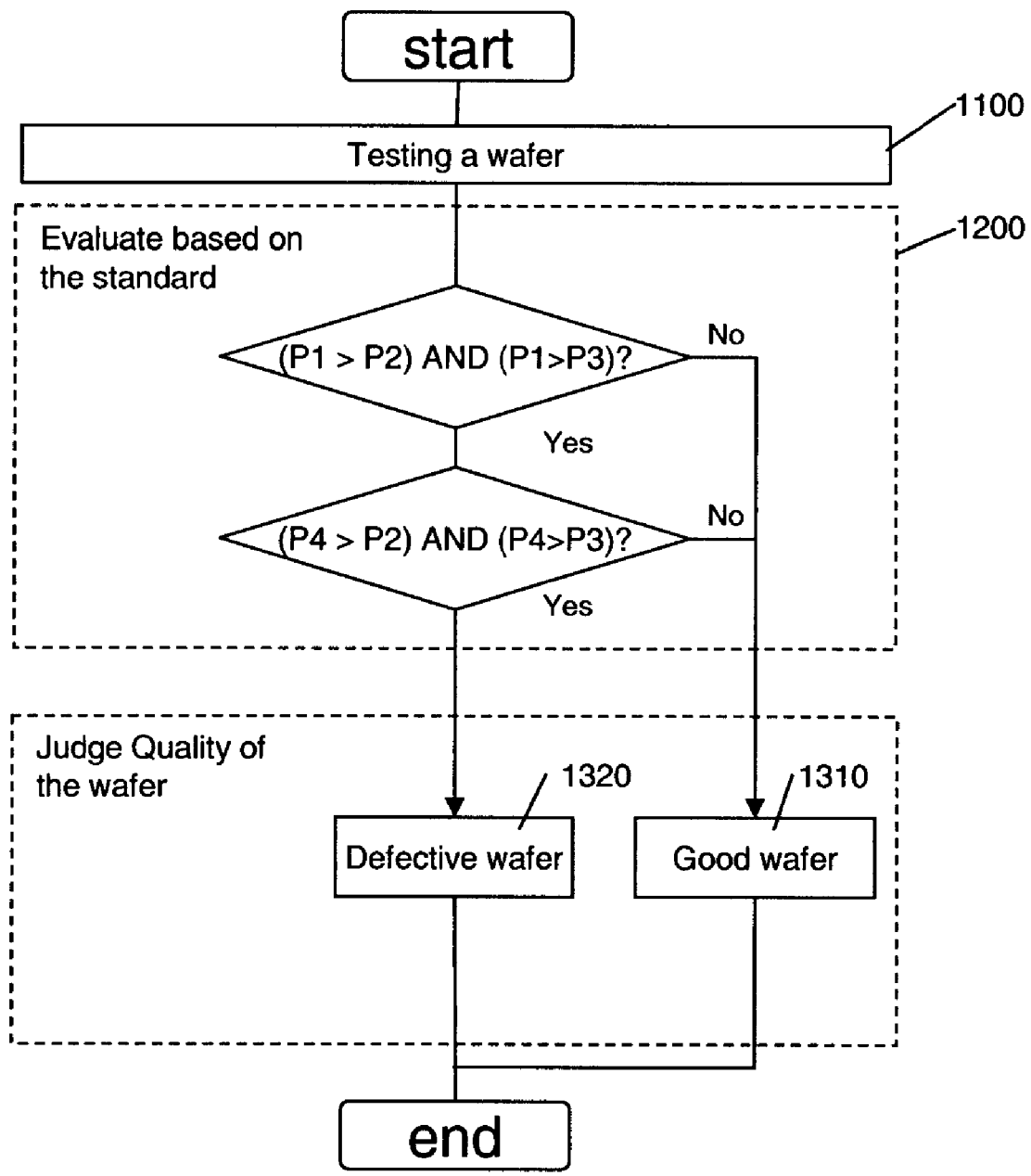
FIG. 12 shows another example of in-line test according to the invention.

Referring to FIG. 12, details of the in-line test are provided according to the second embodiment of the present invention. Leakage current measurements are first performed at points P1 through P4 in the wafer on a product line (step 1100). Then, in the evaluation (step 1200), if the following conditions leakage current at P1>leakage current at P2;

leakage current P1>leakage current P3;

leakage current P4>leakage current P2; and leakage current P4>leakage current P3 are met, the wafer is determined to be defective (step 1320).

As previously stated, the in-line tests are to be performed during the manufacturing process of the wafers, and the quality of the wafers can be determined prior to the wafers being completed.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. An in-line testing method for identifying whether a partially processed semiconductor wafer is good or defective, said semiconductor wafer having a plurality of individual structures built in a surface thereof, the method comprising the steps of:
   a) applying a predetermined voltage and measuring leakage currents at only four points on said semiconductor wafer; and
   b) identifying the defective semiconductor wafer by having the leakage currents increase from the wafer's center toward its middle section followed by decreasing leakage currents from said wafer's middle section toward its periphery.

2. The method of claim 1 wherein a good semiconductor wafer is identified by decreasing leakage currents from said wafer's center towards said wafer's periphery.

3. The method of claim 1 further comprising the step of selecting semiconductor wafers from a production line and accumulating leakage current measurement data from said selected semiconductor wafers.

4. The method of claim 1, wherein said leakage currents are measured at least at three wafer locations P1, P2, and P3, wherein P1 and P2 are positioned substantially toward the periphery of said wafer, and P3 is positioned substantially at the middle of said wafer, and wherein a defective semiconductor wafer is identified by having lower leakage currents at the periphery of said semiconductor wafer at locations P1 and P2 than the leakage currents at the middle of said semiconductor wafer at location P3.

5. The method of claim 1, wherein said structures are field effect transistors (FETs).

6. The method of claim 5, wherein said voltage is applied between the gate and the source or drain of said FET, and said current is measured between the gate and source or drain of said FET.

7. The method of claim 1, wherein said correlation map is indicative of the presence or absence of silicon erosion.

8. The method of claim 1, wherein said in-line test is performed at the front-end of line (FEOL) for processing said semiconductor wafer.

9. The method of claim 1, wherein the structures are positioned in kerfs of said semiconductor wafer.

10. The method of claim 1, wherein said leakage current measurements are performed in at least three positions of at least three separate structures of said semiconductor wafer including a first position at a structure located in proximity of the center of said semiconductor wafer, a second position at a structure located in proximity of the periphery of said semiconductor wafer and a third point a structure located between the center and the periphery of said semiconductor wafer.

11. The method of claim 1, wherein the predetermined voltage varies from about 0.1V to 1V.

* * * * *